(12) United States Patent
Yang et al.

(10) Patent No.: US 7,869,191 B2
(45) Date of Patent: Jan. 11, 2011

(54) UNINTERRUPTIBLE POWER SUPPLY APPARATUS

(75) Inventors: Yung-Hung Yang, Taoyuan Hsien (TW); Yu-Ming Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 103 days.

(21) Appl. No.: 12/357,091

(22) Filed: Jan. 21, 2009

(65) Prior Publication Data

US 2010/0181836 A1    Jul. 22, 2010

(51) Int. Cl.
*H02B 1/50* (2006.01)
*H02J 9/06* (2006.01)

(52) U.S. Cl. ................ 361/601; 361/825; 307/66

(58) Field of Classification Search ......... 361/601, 361/825; 307/66
See application file for complete search history.

(56) References Cited

U.S. PATENT DOCUMENTS

| | | | | | |
|---|---|---|---|---|---|
| D314,174 S | * | 1/1991 | Wong | ........................ | D13/123 |
| D314,183 S | * | 1/1991 | Wong | ........................ | D13/160 |
| D316,396 S | * | 4/1991 | Decosse et al. | ............ | D13/110 |
| D339,101 S | * | 9/1993 | Delamoreaux et al. | ..... | D13/110 |
| 5,244,411 A | * | 9/1993 | Schinke et al. | .............. | 439/516 |
| 5,701,244 A | * | 12/1997 | Emmert et al. | .............. | 363/146 |
| D403,662 S | * | 1/1999 | Caldes et al. | ............. | D13/110 |
| D406,100 S | * | 2/1999 | Murphy | ..................... | D13/110 |
| D425,866 S | * | 5/2000 | Nagasawa et al. | .......... | D13/147 |
| D431,557 S | * | 10/2000 | Lutz et al. | .................. | D14/242 |
| D440,937 S | * | 4/2001 | Germagian et al. | ........ | D13/110 |
| 6,317,348 B1 | * | 11/2001 | Vackar | ....................... | 363/144 |
| D456,352 S | * | 4/2002 | Germagian et al. | ........ | D13/110 |
| 6,456,507 B1 | * | 9/2002 | Yang et al. | ................... | 361/829 |
| 6,486,789 B2 | * | 11/2002 | Germagian et al. | ...... | 340/693.5 |
| 6,636,432 B2 | * | 10/2003 | Chao | .......................... | 363/146 |
| D482,653 S | * | 11/2003 | Cho | .......................... | D13/110 |
| 6,661,669 B1 | * | 12/2003 | Cho | .......................... | 361/752 |
| D506,976 S | * | 7/2005 | Dechene et al. | ............ | D13/110 |
| D513,253 S | * | 12/2005 | Kawasaki | .................. | D14/363 |
| D525,972 S | * | 8/2006 | Liu | .......................... | D14/356 |
| D530,276 S | * | 10/2006 | Albano et al. | .............. | D13/110 |
| D534,910 S | * | 1/2007 | Weiher et al. | .............. | D14/356 |
| 7,202,576 B1 | * | 4/2007 | Dechene et al. | ............. | 307/66 |
| 7,385,805 B2 | * | 6/2008 | Germagian et al. | ......... | 361/644 |
| 7,397,654 B2 | * | 7/2008 | Mori | ..................... | 361/679.01 |
| 7,417,850 B1 | * | 8/2008 | Pulido | .................. | 361/679.01 |
| D580,423 S | * | 11/2008 | Ju | .............................. | D14/240 |
| D590,771 S | * | 4/2009 | Yeh | ........................... | D13/110 |
| D606,937 S | * | 12/2009 | Brookshire et al. | ........ | D13/110 |
| 2002/0105230 A1 | * | 8/2002 | Ziegler et al. | ................ | 307/64 |
| 2007/0211421 A1 | * | 9/2007 | Sween et al. | ................ | 361/683 |

* cited by examiner

*Primary Examiner*—Anatoly Vortman
(74) *Attorney, Agent, or Firm*—Kirton & McConkie; Evan R. Witt

(57) ABSTRACT

An uninterruptible power supply (UPS) apparatus is disclosed. The UPS apparatus comprises a UPS main body and a support. The UPS main body includes a power supply unit for receiving AC power from a power source and converting AC power to DC power, a battery unit for receiving DC power from the power supply unit and providing DC power to a load, and a case for housing the power supply unit and the battery unit therein, wherein a bottom surface of the case has a first width. The support is used to support the UPS main body thereon to enable the UPS apparatus to stand on a desk, wherein a bottom surface of the support has a second width larger than the first width. Therefore, the UPS apparatus can be served as a desktop DC UPS.

19 Claims, 8 Drawing Sheets

UNINTERRUPTIBLE POWER SUPPLY APPARATUS

FIELD OF THE INVENTION

The present invention relates to an uninterruptible power supply apparatus, and more particularly to a desktop DC uninterruptible power supply apparatus.

BACKGROUND OF THE INVENTION

The optical fiber communication has been widely used in recent years since it possesses advantages of the high quality, high speed, and long transmission distance. In user's end, there is installed an optical fiber communication system to enable the light signals transmitted by the optical fiber to enter the user's house or office. The optic fiber communication system includes an optical network terminal (ONT), a broadband home router (BHR), a battery backup unit (BBU) and an optical network terminal power supply unit (OPSU).

The ONT is connected with the optical fiber cable, and when the light reaches the use's house or office through the optical fiber cable, the ONT receives the light signals and converts the light signals into electric signals. On the other hand, when the information is to be sent from the user's end, it will be converted from electric signals into light signals by the ONT. The BHR is connected to the ONT and is used to check the transmitted signals, set the transmission route, and transmit the signals to the predetermined location in the user's end. The OPSU is used to convert the commercial AC power into DC power and transmit the DC power to the BBU, and the DC power is provided to the ONT for the operation thereof through the BBU. The power is also stored in the battery of the BBU, and when the OPSU is accidentally unplugged or in the event of a commercial power failure, the BBU provides backup power to the ONT for emergency use.

Generally, the ONT is installed on the wall in the user's house or office, and thus the OPSU and the BBU are also designed to be hung on the wall near where the ONT is installed to provide power to the ONT. To extend the application of the OPSU and the BBU, the present invention provides a new structure of the OPSU and the BBU so that it can be used for other desktop electric devices.

SUMMARY OF THE INVENTION

An object of the present invention is to extend the application of the OPSU and the BBU by providing a support to enable the OPSU and the BBU to stand on the desk and be served as a desktop DC UPS.

According to an aspect of the present invention, there is provided an uninterruptible power supply (UPS) apparatus. The UPS apparatus comprises a UPS main body and a support. The UPS main body includes a power supply unit for receiving AC power from a power source and converting AC power to DC power, a battery unit for receiving DC power from the power supply unit and providing DC power to a load, and a case for housing the power supply unit and the battery unit therein, wherein a bottom surface of the case has a first width. The support is used to support the UPS main body thereon to enable the UPS apparatus to stand on a desk, wherein a bottom surface of the support has a second width larger than the first width.

Preferably, the UPS apparatus is a desktop DC UPS.

In an embodiment, the support includes a base plate and a side plate, the base plate has the bottom surface having the second width, and the side plate is substantially perpendicular to the base plate.

In an embodiment, the support includes at least a hook protruded from the side plate, and the hook is inserted into a corresponding hole on a back surface of the UPS main body.

In an embodiment, the support includes at least a supporting block disposed on the base plate. The supporting block has a top surface which is against the bottom surface of the UPS main body for supporting the UPS main body thereon.

In an embodiment, the support includes a clamping block disposed on a front end of the base plate, and the clamping block has a first surface which is against a front surface of the UPS main body. Meanwhile, the side plate of the support is against a back surface of the UPS main body, so that the UPS main body is clamped between the clamping block and the side plate of the support.

In an embodiment, the clamping block further has a second surface which is against the bottom surface of the UPS main body to assist in supporting the UPS main body.

In an embodiment, the UPS main body further comprises an AC cable for receiving AC power from the power source and a DC cable for providing DC power to the load.

In an embodiment, a space is formed between the bottom surface of the UPS main body and the base plate of the support for arranging the AC cable and the DC cable.

In an embodiment, the support includes a cable arranging structure disposed on the base plate of the support. The cable arranging structure has protrusions extending downwardly to form compartments for arranging and restricting the AC cable and the DC cable therein.

In an embodiment, the support includes a base plate, a front side plate and a back side plate, wherein the base plate has the bottom surface having the second width. A distance between the front side plate and the back side plate is substantially identical to the first width of the bottom surface of the UPS main body. The front side plate and the back side plate are against a front surface and a back surface of the UPS main body, respectively, to clamp the UPS main body therebetween.

In an embodiment, the UPS main body further comprises an AC cable for receiving AC power from the power source and a DC cable for providing DC power to the load, and the support includes a cable arranging structure disposed on the back side plate of the support. The cable arranging structure has protrusions extending toward the back side plate to form compartments for arranging and restricting the AC cable and the DC cable therein.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention relates to an uninterruptible power supply (UPS) apparatus, and is a new application for an optical network terminal power supply unit (OPSU) with a battery backup unit (BBU). The OPSU and the BBU are originally designed for the use of an optical network terminal (ONT), which converts light signals into electric signals and is usually installed on the wall of the use's house or office. In the present invention, the OPSU and the BBU are designed to be used as a desktop DC UPS apparatus for common home or office electric devices that require DC power, such as but not limited to computer, server and fax machine.

Figure 1:
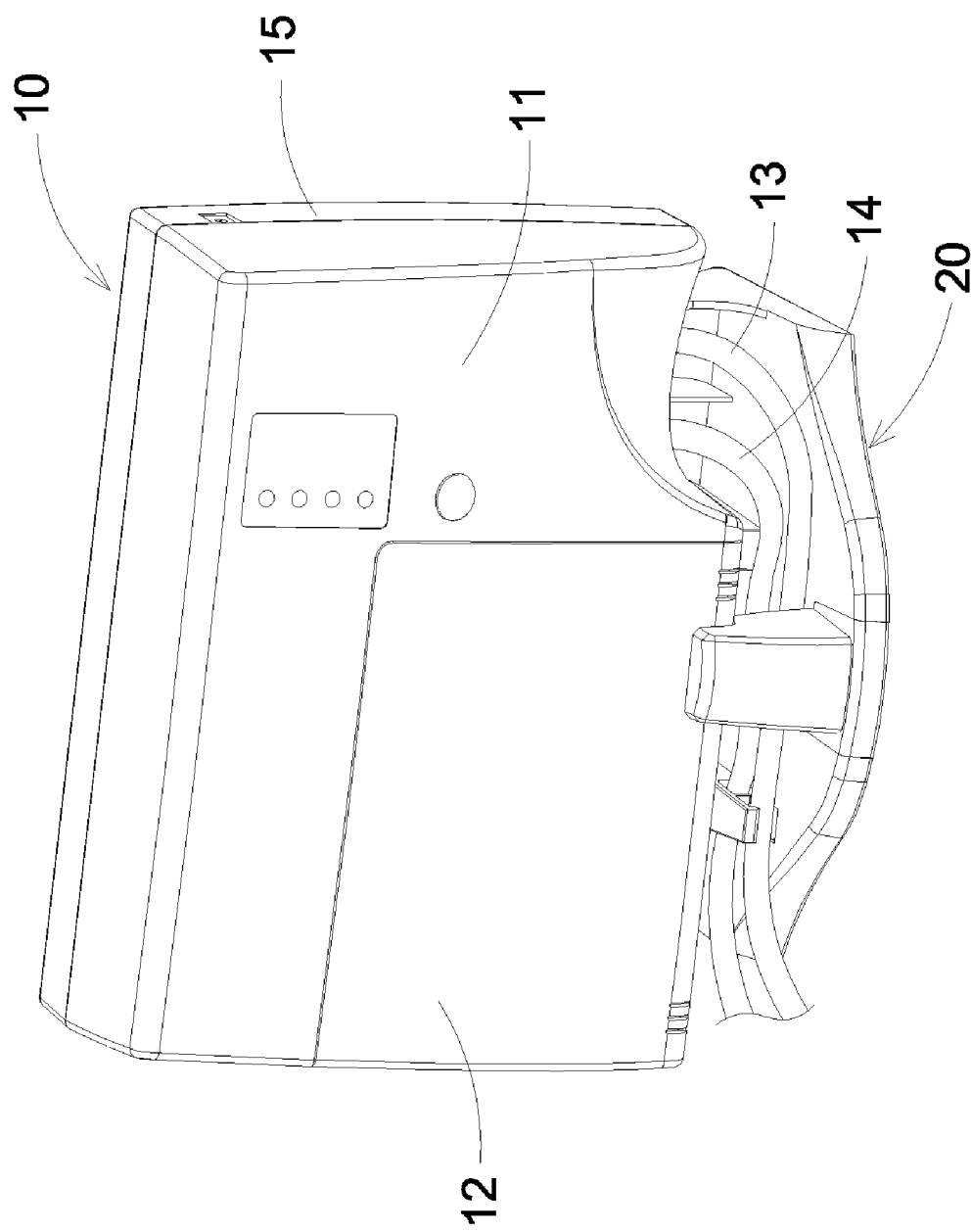
FIG. 1 is a schematic diagram showing the UPS apparatus according to a preferred embodiment of the present invention.

Please refer to FIG. 1, which is a schematic diagram showing the UPS apparatus according to a preferred embodiment of the present invention. As shown in FIG. 1, the UPS apparatus 1 includes a UPS main body 10 and a support 20. The UPS main body 10 includes a power supply unit 11 and a battery unit 12, wherein the power supply unit 11 receives AC power from a power source, for example a socket (not shown), through an AC cable 13 and converts AC power to DC power, and the battery unit 12 receives and stores DC power from the power supply unit 11 and provides DC power to a load, which may by any home or office electric device that require DC power (not shown), through a DC cable 14. In the embodiment shown in FIG. 1, the power supply unit 11 and the battery unit 12 are integrated and housed in a case 15; however, the power supply unit 11 and the battery unit 12 can also be detachable units that are housed by respective cases and can be engaged together. The support 20 is used to support the UPS main body 10 so as to enable the UPS main body 10 to stand on the desk.

Figure 2:
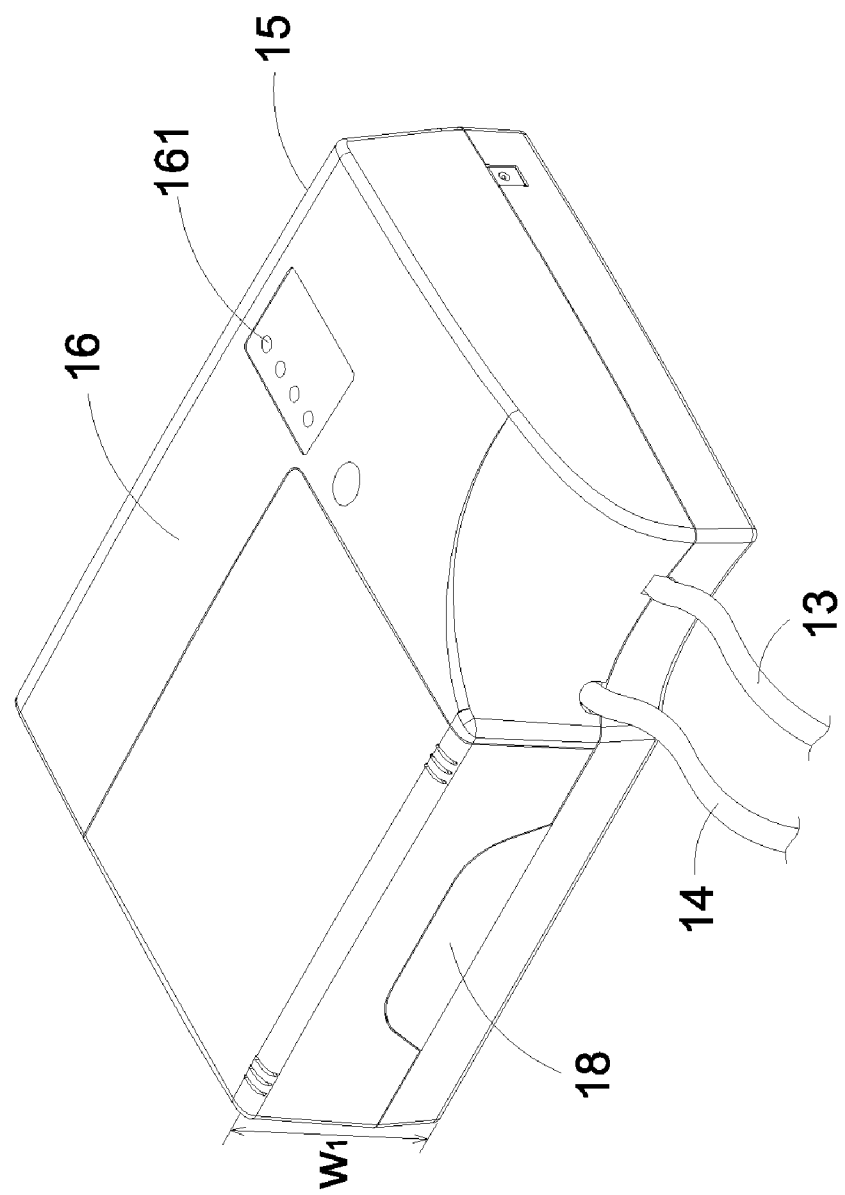
FIGS. 2 and 3 show different views of the UPS main body of the UPS apparatus in FIG. 1.
Figure 3:
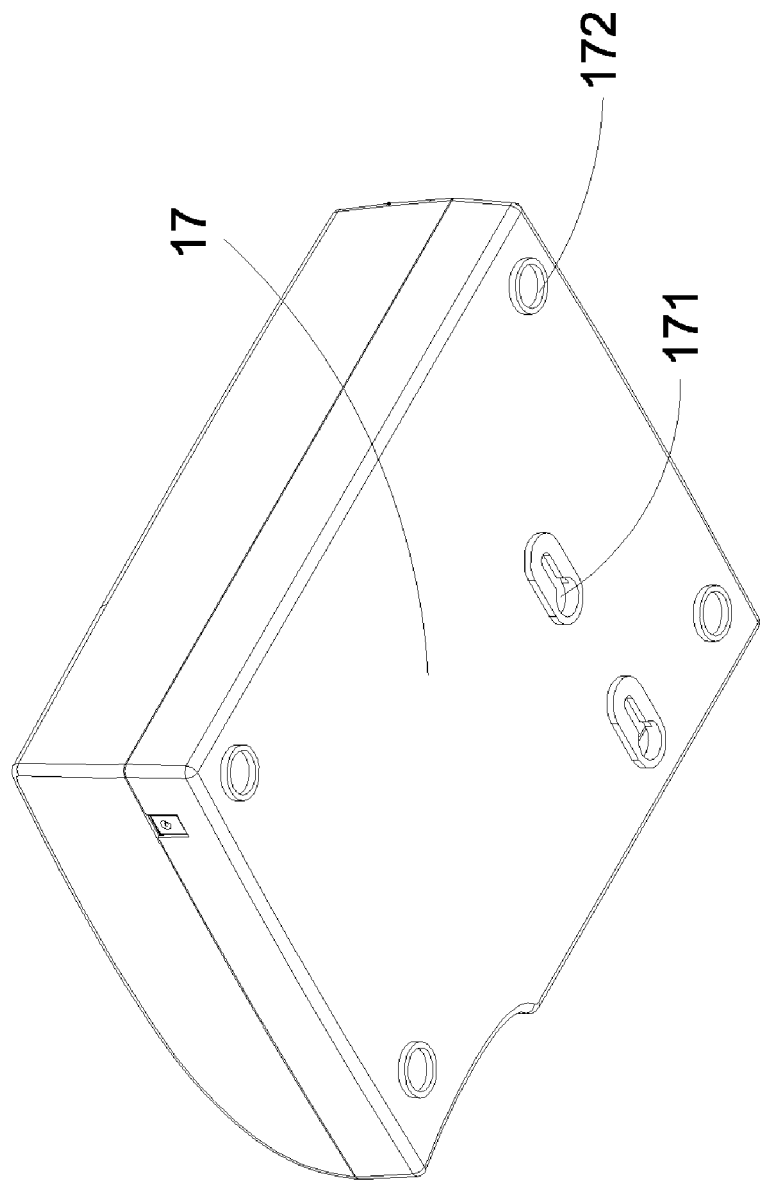

Please refer to FIGS. 2 and 3, which show different views of the UPS main body of the UPS apparatus. The case 15 of the UPS main body 10 includes a front surface 16, a back surface 17 and a bottom surface 18. The front surface 16 has at least an indicator light 161 for indicating the operation status of the UPS main body 10, and the back surface 17 has at least a hole 171, which is originally designed to be hooked with a hook on the wall so as to fix the UPS main body 10 on the wall near where the ONT is installed. The bottom surface 18 of the case 15 is substantially perpendicular to both the front surface 16 and the back surface 17 and has a width $W_1$.

To extend the application of the UPS other than the use for the ONT, the UPS may be placed on the desk where other home or office electric device is placed by lying the UPS on the desk with the back surface 17, and the back surface 17 may further includes plural legs 172 to facilitate the placement of the UPS. However, since the back surface 17 is relatively large, the UPS will occupy lots of the working area, which causes waste of space. Therefore, the present invention provides a support 20 for supporting the UPS main body 10 so as to enable the UPS main body 10 to stand on the desk with the smaller bottom surface 18 downward to reduce the space occupation and increase the stability for the standing of the UPS.

Figure 4:
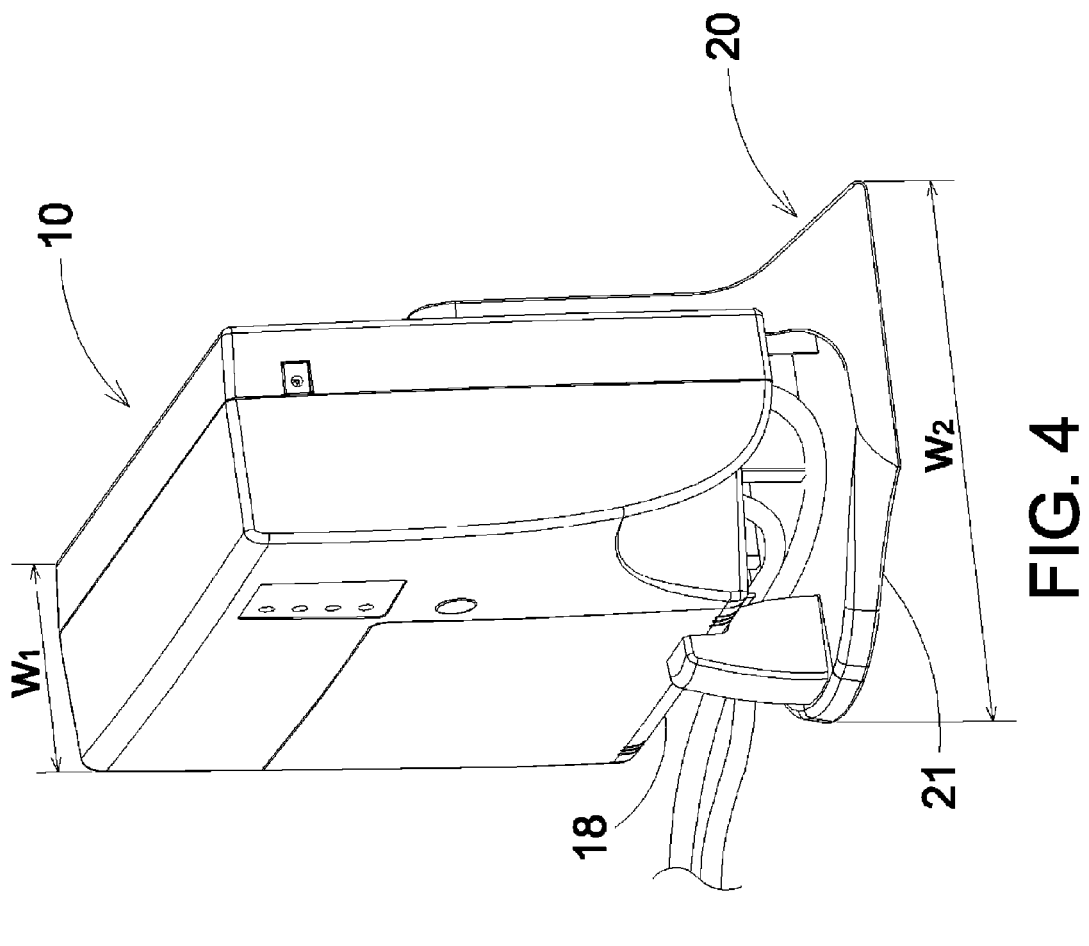
FIG. 4 is a side view of the UPS apparatus in FIG. 1.

Please refer to FIG. 4, which is a side view of the UPS apparatus in FIG. 1. Since the bottom surface 18 of the main body 10 has a relatively small area and a small width $W_1$, it may not be able to support the UPS main body 10 stably when lying the UPS on the desk with the bottom surface 18. To overcome this defect, the support 20 is provided to hold the UPS main body 10 thereon and a bottom surface 21 of the support 20 has a width $W_2$ which is bigger than the width $W_1$ of the bottom surface 18 of the UPS main body 10. Accordingly, the UPS apparatus 1 including the UPS main body 10 and the support 20 can stand on the desk stably and can be used as a desktop DC UPS for providing DC power to the home or office electric device.

Figure 5:
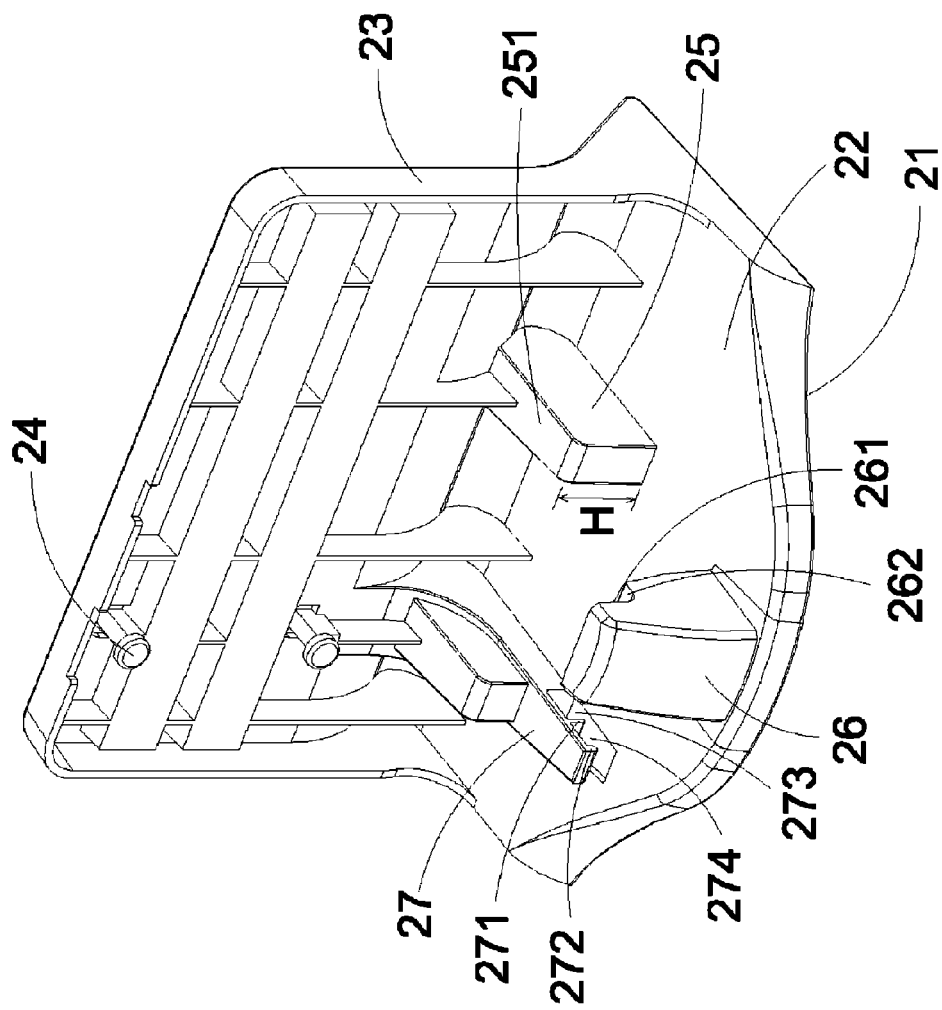
FIG. 5 is a schematic diagram showing the support of the UPS apparatus in FIG. 1.

Please refer to FIG. 5, which is a schematic diagram showing the support according to the preferred embodiment of the present invention. The support 20 includes a base plate 22 and a side plate 23, the base plate 22 includes the bottom surface 21 which has the width $W_2$ and is contacted to the desk where the UPS apparatus 1 is placed, and the side plate 23 is substantially perpendicular to the base plate 22. The support 20 further has at least a hook 24 protruded from the side plate 23, and the hook 24 is to be inserted into the corresponding hole 171 on the back surface 17 of the UPS main body 10, so that the UPS main body 10 can be hung on the side plate 23 of the support 20 via the hook 24. Besides, the support 20 includes at least a supporting block 25 disposed on the base plate 22. The supporting block 25 has a top surface 251 which is against the bottom surface 18 of the UPS main body 10, so as to further support the UPS main body 10 thereon and reduce the loading of the hook 24 on the side plate 23. Moreover, the support 20 includes a clamping block 26 disposed on the front end of the base plate 22. The clamping block 26 has a first surface 261 which is against the front surface 16 of the UPS main body 10 when the UPS main body 10 is held on the support 20, and meanwhile, the back surface 17 of the UPS main body 10 is also against the side plate 23 of the support 20, so that the UPS main body 10 is firmly held and clamped between the clamping block 26 and the side plate 23 of the support 20 (as shown in FIG. 4). In an embodiment of the present invention, the clamping block 26 can further has a second surface 262 which is against the bottom surface 18 of the UPS main body 10 to assist in supporting the UPS main body 10 when the UPS main body 10 is held on the support 20, wherein the second surface 262 of the clamping block 26 and the top surface 251 of the supporting block 25 are at the same level.

In addition, the supporting block 25 has a height H, and thus, when the UPS main body 10 is supported on the supporting block 25, there is a distance H between the bottom surface 18 of the UPS main body 10 and the base plate 22 of the support 20, so a space is formed therebetween and can be provided as a space for arranging the AC cable 13 and the DC cable 14 extended from the bottom side of the UPS main body 10. Furthermore, the support 20 may include a cable arranging structure 27 disposed on the base plate 22 of the support 20. The cable arranging structure 27 has protrusions 271, 272 extending downwardly to form compartments 273, 274 for arranging and restricting the AC cable 13 and the DC cable 14, respectively, therein (as shown in FIG. 1), so that the appearance of the UPS apparatus 1 can be much tidier.

Figure 6:
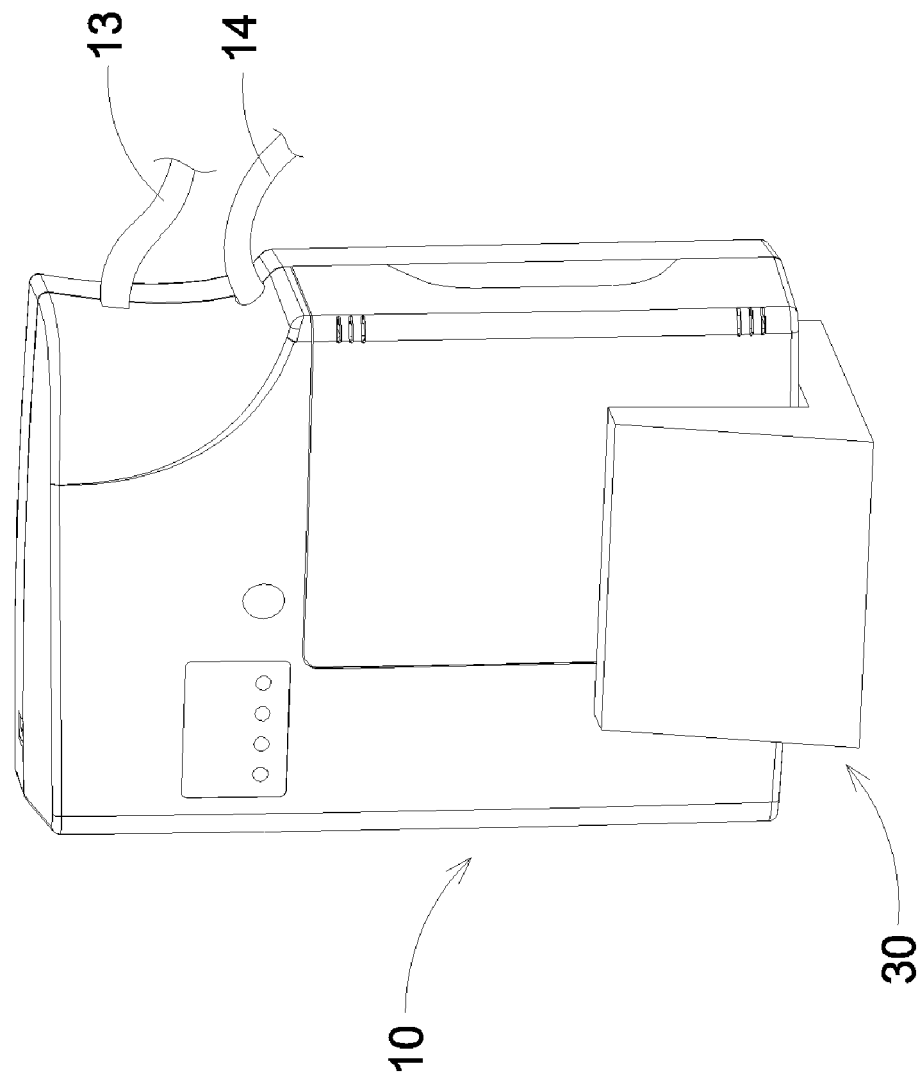
FIG. 6 is a schematic diagram showing the UPS apparatus according to another preferred embodiment of the present invention.

Please refer to FIG. 6, which is a schematic diagram showing the UPS apparatus according to another preferred embodiment of the present invention. As shown in FIG. 6, the UPS apparatus 2 includes a UPS main body 10 and a support 30. The UPS main body 10 is the same as that is shown in FIG. 1, but the AC cable 13 and the DC cable 14 are extended from a lateral side of the UPS main body 10 when the UPS main body 10 is held on the support 30. Please also refer to FIG. 7, which is a side view of the UPS apparatus in FIG. 6. The support 30 includes a base plate 31, a front side plate 32 and a back side plate 33. The UPS main body 10 includes a bottom surface 19 which has a width $W_1$, and a bottom surface 34 of the base plate 31 of the support 30 has a width $W_3$ bigger than the width $W_1$ of the bottom surface 19 of the UPS main body 10. Further, the distance between the front side plate 32 and the back side plate 33 is substantially identical to the width $W_1$ of the bottom surface 19 of the UPS main body 10, and when the UPS main body 10 is supported on the base plate 31 of the support 30, the front side plate 32 and the back side plate 33 are against the front surface 16 and the back surface 17 of the UPS main body 10, respectively, so the UPS main body 10 can be firmly held by the support 30 and the whole UPS apparatus 2 can be stably stand on the desk and served as a desktop DC UPS for any home or office electric device that require DC power.

Figure 7:
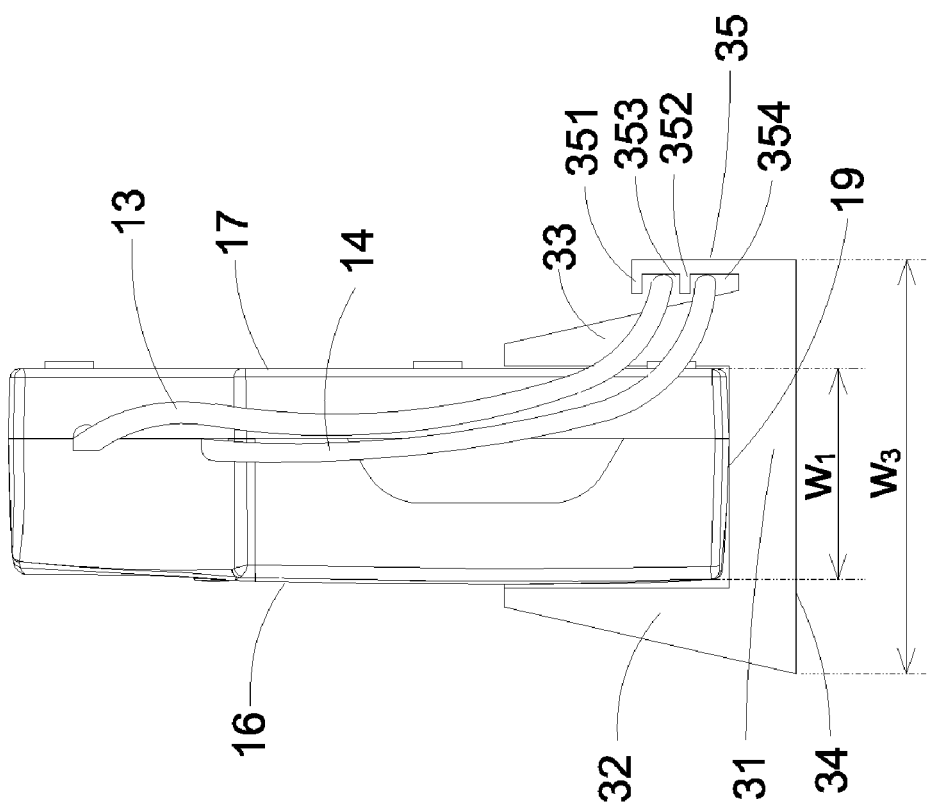
FIG. 7 is a side view of the UPS apparatus in FIG. 6.
Figure 8:
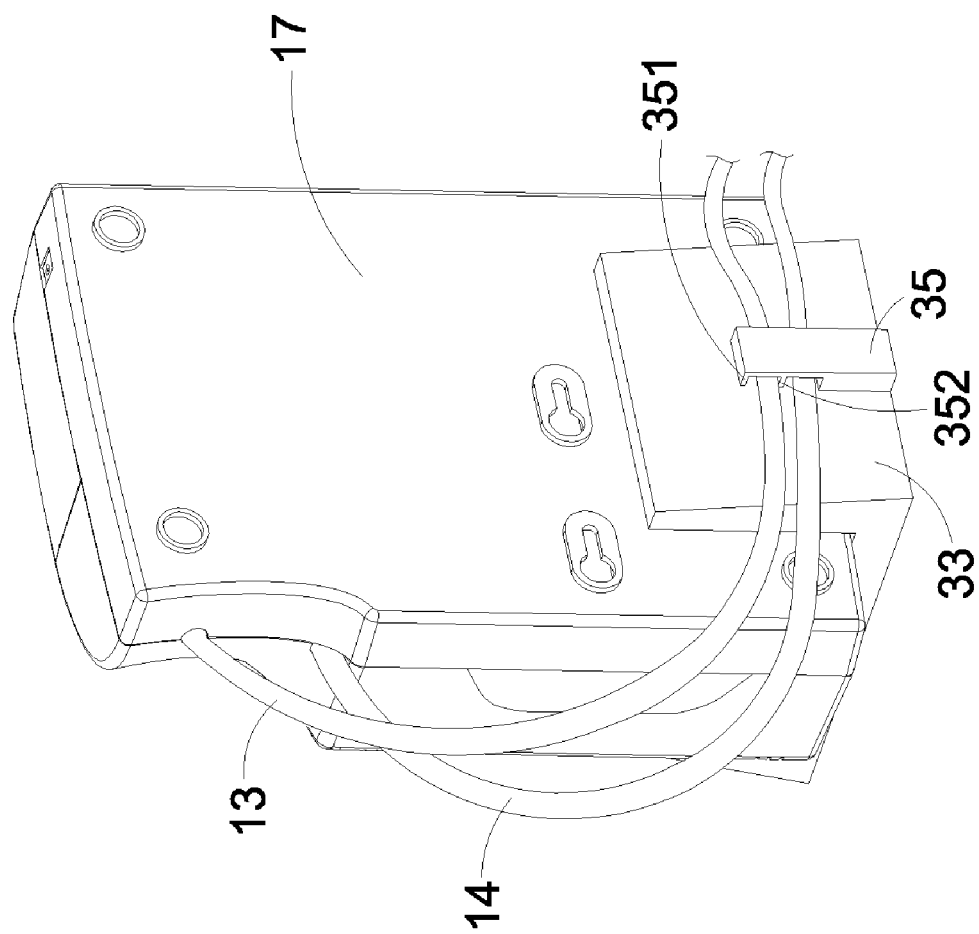
FIG. 8 is a backside view of the UPS apparatus in FIG. 6.

Please refer to FIGS. 7 and 8, wherein FIG. 8 is a backside view of the UPS apparatus in FIG. 6. The support 30 further includes a cable arranging structure 35 disposed on the back side plate 33 of the support 30. The cable arranging structure 35 is formed as a clip, for example, and has protrusions 351, 352 extending toward the back side plate 33 to form compartments 353, 354 for arranging and restricting the AC cable 13 and the DC cable 14, respectively, therein, so that the appearance of the UPS apparatus 1 can be much tidier.

From the above, the present invention extends the application of the OPSU and the BBU, which is originally designed to be hung on the wall near where the ONT is installed and provide DC power to the ONT, by providing a support to enable the UPS main body to stand on the desk without too much space occupation and to be served as a desktop DC UPS for any home or office electric device that require DC power. Since the bottom surface of the support has a bigger width than that of the bottom surface of the UPS main body, the UPS apparatus can stably stand on the desk near where the electric device is placed. According to the present invention, it doesn't need to modify the original design of the OPSU and the BBU but only provide a support to enable the OPSU and the BBU to be a desktop DC UPS for any home or office electric device that require DC power. Therefore, the present invention possesses industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An uninterruptible power supply (UPS) apparatus, comprising:
    a UPS main body including:
    a power supply unit for receiving AC power from a power source and converting AC power to DC power;
    a battery unit for receiving DC power from the power supply unit and providing DC power to a load; and
    a case for housing the power supply unit and the battery unit therein, wherein a bottom surface of the case has a first width; and
    a support for supporting the UPS main body thereon to enable the UPS apparatus to stand on a desk, wherein a bottom surface of the support has a second width larger than the first width, the support includes a base plate and a side plate, the base plate has the bottom surface having the second width, and the side plate is substantially perpendicular to the base plate.

2. The UPS apparatus according to claim 1 being a desktop DC UPS.

3. The UPS apparatus according to claim 1 wherein the support includes at least a hook protruded from the side plate, and the hook is inserted into a corresponding hole on a back surface of the UPS main body.

4. The UPS apparatus according to claim 1 wherein the support includes at least a supporting block disposed on the base plate.

5. The UPS apparatus according to claim 4 wherein the supporting block has a top surface which is against the bottom surface of the UPS main body for supporting the UPS main body thereon.

6. The UPS apparatus according to claim 1 wherein the support includes a clamping block disposed on a front end of the base plate, and the clamping block has a first surface which is against a front surface of the UPS main body.

7. The UPS apparatus according to claim 6 wherein the side plate of the support is against a back surface of the UPS main body, so that the UPS main body is clamped between the clamping block and the side plate of the support.

8. The UPS apparatus according to claim 6 wherein the clamping block further has a second surface which is against the bottom surface of the UPS main body to assist in supporting the UPS main body.

9. The UPS apparatus according to claim 1 wherein the UPS main body further comprises an AC cable for receiving AC power from the power source and a DC cable for providing DC power to the load.

10. The UPS apparatus according to claim 9 wherein a space is formed between the bottom surface of the UPS main body and the base plate of the support for arranging the AC cable and the DC cable.

11. The UPS apparatus according to claim 9 wherein the support includes a cable arranging structure disposed on the base plate of the support.

12. The UPS apparatus according to claim 11 wherein the cable arranging structure has protrusions extending downwardly to form compartments for arranging and restricting the AC cable and the DC cable therein.

13. An uninterruptible power supply (UPS) apparatus, comprising:
    a UPS main body including:
    a power supply unit for receiving AC power from a power source and converting AC power to DC power;
    a battery unit for receiving DC power from the power supply unit and providing DC power to a load; and
    a case for housing the power supply unit and the battery unit therein, wherein a bottom surface of the case has a first width; and
    a support for supporting the UPS main body thereon to enable the UPS apparatus to stand on a desk, wherein a bottom surface of the support has a second width larger than the first width, the support includes a base plate, a front side plate and a back side plate.

14. The UPS apparatus according to claim 13 wherein the base plate has the bottom surface having the second width.

15. The UPS apparatus according to claim 13 wherein a distance between the front side plate and the back side plate is substantially identical to the first width of the bottom surface of the UPS main body.

16. The UPS apparatus according to claim 15 wherein the front side plate and the back side plate are against a front surface and a back surface of the UPS main body, respectively, to clamp the UPS main body therebetween.

17. The UPS apparatus according to claim 13 wherein the UPS main body further comprises an AC cable for receiving AC power from the power source and a DC cable for providing DC power to the load.

18. The UPS apparatus according to claim 17 wherein the support includes a cable arranging structure disposed on the back side plate of the support.

19. The UPS apparatus according to claim 18 wherein the cable arranging structure has protrusions extending toward the back side plate to form compartments for arranging and restricting the AC cable and the DC cable therein.

* * * * *